United States Patent
Kim

(10) Patent No.: US 8,416,599 B2
(45) Date of Patent: Apr. 9, 2013

(54) METAL OXIDE SEMICONDUCTOR (MOS) FIELD EFFECT TRANSISTOR HAVING TRENCH ISOLATION REGION AND METHOD OF FABRICATING THE SAME

(75) Inventor: Myoung-Soo Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 916 days.

(21) Appl. No.: 12/498,652

(22) Filed: Jul. 7, 2009

(65) Prior Publication Data

US 2009/0269898 A1 Oct. 29, 2009

Related U.S. Application Data

(63) Continuation of application No. 11/416,736, filed on May 3, 2006, now abandoned.

(30) Foreign Application Priority Data

Jun. 9, 2005 (KR) .............................. 2005-0049251

(51) Int. Cl.
*G11C 11/00* (2006.01)
(52) U.S. Cl.
USPC ........................................................ 365/148
(58) Field of Classification Search .................... 365/46, 365/94, 100, 129, 148, 163; 257/2–5, 9, 257/288, 310, 506, E21.35; 438/95, 96, 135, 438/166, 240, 365, 482, 486, 597, 785
See application file for complete search history.

(56) References Cited

U.S. PATENT DOCUMENTS

| | | | |
|---|---|---|---|
| 6,627,928 B2 * | 9/2003 | Peschiaroli et al. | .......... 257/288 |
| 2002/0197823 A1 * | 12/2002 | Yoo et al. | ...................... 438/424 |
| 2003/0082861 A1 | 5/2003 | Mayuzumi | |

FOREIGN PATENT DOCUMENTS

| | | |
|---|---|---|
| JP | 08-046201 | 2/1996 |
| JP | 11-154747 | 6/1999 |
| JP | 2000-269484 | 9/2000 |
| JP | 2001-068563 | 3/2001 |
| JP | 2001-160589 | 6/2001 |
| JP | 2002-222942 | 8/2002 |
| JP | 2004-336052 | 11/2004 |

OTHER PUBLICATIONS

English Translation of Chinese Office Action dated May 8, 2009 issued in connection with corresponding Chinese application No. 200610084290.8.

* cited by examiner

*Primary Examiner* — Harry W Byrne
(74) *Attorney, Agent, or Firm* — F. Chau & Associates, LLC

(57) ABSTRACT

A leakage current occurring on a boundary of a trench isolation region and an active region can be prevented in a Metal Oxide Semiconductor (MOS) Field Effect transistor, and a fabricating method thereof is provided. The transistor includes the trench isolation region disposed in a predetermined portion of a semiconductor substrate to define the active region. A source region and a drain region are spaced apart from each other within the active region with a channel region disposed between the source region and the drain region. A gate electrode crosses over the channel region between the source region and the drain region, and a gate insulating layer is disposed between the gate electrode and the channel region. An edge insulating layer thicker than the gate insulating layer is disposed on a lower surface of the gate electrode around the boundary of the trench isolation region and the active region.

20 Claims, 4 Drawing Sheets

METAL OXIDE SEMICONDUCTOR (MOS) FIELD EFFECT TRANSISTOR HAVING TRENCH ISOLATION REGION AND METHOD OF FABRICATING THE SAME

CROSS-REFERENCE TO RELATED PATENT APPLICATION

This application is a continuation of U.S. patent application Ser. No. 11/416,736, filed May 3, 2006,now abandoned which claims the priority under 35 U.S.C. §119 to Korean Patent Application No. 10-2005-0049251, filed on Jun. 9, 2005, in the Korean Intellectual Property Office, the disclosures of which are each incorporated by reference herein in their entireties.

BACKGROUND OF THE INVENTION

1. Field of the Invention

The present invention relates to a semiconductor device and a method of fabricating the same, and more particularly to a Metal Oxide Semiconductor (MOS) Field Effect Transistor having a trench isolation region and a method of fabricating the same.

2. Description of the Related Art

When fabricating electric power devices such as Liquid Crystal Display (LCD) Driver ICs ("referred to as LDIs") in semiconductor integrated circuit devices, a low voltage transistor for logic operated at a low voltage and an LCD driving transistor operated at a high voltage should both be embodied together on the same semiconductor substrate. Generally, a high voltage transistor has a structure such as a Modified Lightly Doped Drain (MLDD) and a Field Lightly Doped Drain (FLDD), which includes a thick gate oxide layer. As the increased density of a emiconductor integrated circuit reduces linewidth, trench isolation techniques are thus generally applied to a device isolation region when forming the above electric power devices. For example, in a Shallow Trench Isolation (STI) structure formed using a trench technique, a layer used for gap fill is not a thermal oxide layer but an undoped silicate glass (USG) layer or a Chemical Vapor Deposition (CVD) oxide layer such as a High Density Plasma (HDP)-CVD oxide layer. In addition, in the above described trench isolation process, a nitride liner is typically used.

FIG. 1 is a sectional view of a conventional high voltage MOS Field Effect Transistor having a trench isolation region.

Referring to FIG. 1, a P-type well 101 doped with a P-type impurity or an N-type well doped with an N-type impurity ion is formed on an upper surface of a semiconductor substrate 100. A trench isolation region 107 with an STI structure filled with an insulating material is then formed in a predetermined portion of the well 101. An active region 102 is defined by the trench isolation region 107. A source region and a drain region (not shown) spaced apart from each other by a prescribed distance are formed within the active region 102. Additionally, a channel region is disposed between the source and the drain regions. A gate electrode 106 is formed on the channel region by interposing a gate insulating layer 105.

The gate insulating layer 105 is mainly composed of thermal oxide, in which a thinning phenomenon of an oxide layer disposed on an upper edge of the trench-etched STI structure occurs. In particular, the above-mentioned thinning phenomenon occurs due to the following: a compressive stress induced on a silicon substrate caused by (i) oxidation of the surface of the silicon substrate and a sidewall of the STI structure, (ii) a stress upon a gap fill layer with the STI structure, and (iii) an interruption of the migration of a oxidation reaction gas by a nitride liner formed within the STI structure when thermal oxidation is performed to form a gate oxide layer in the STI structure.

Moreover, the above-mentioned thinning phenomenon leads to what is known as an edge crowding which in turn results in an STI structure being formed structurally with a dent around a boundary between the device isolation region (or a field region) and an adjacent active region. Furthermore, as a result of the oxide layer being thinned due the above mentioned dent, the nitride liner disposed within the STI isolation region becomes a site for trapping charges to an upper portion of the nitride liner, thereby turning on the transistor via the oxide layer. In addition, the above-mentioned thinning phenomenon and dent results in the threshold voltage of the transistor being lowered by the leakage current on the boundary portion of the trench isolation region and the active region to cause malfunctioning of the semiconductor transistor.

Thus, there is a need for a MOS Field Effect Transistor having a trench isolation region which prevents the occurrence of a leakage current on a boundary of the trench isolation region and an active region,

SUMMARY OF THE INVENTION

According to an exemplary embodiment of the present invention, a Metal Oxide Semiconductor (MOS) Field Effect Transistor is provided. The MOS Field Effect Transistor includes a trench isolation region disposed in a predetermined portion of a semiconductor substrate to define an active region, a source region and a drain region spaced apart from each other within the active region with a channel region disposed between the source region and the drain region, and a gate electrode which crosses over the channel region disposed between the source region and the drain region. The MOS Field Effect Transistor further includes a gate insulating layer disposed between the gate electrode and the channel region, and an edge insulating layer thicker than the gate insulating layer which is disposed on a lower surface of the gate electrode around a boundary of the trench isolation region and the active region.

The edge insulating layer may comprise a plurality of layers, and an uppermost layer of the edge insulating layer and the gate insulating layer may be composed of an identical material. The edge insulating layer may have a triple-layered structure of a lower oxide layer/an intermediary insulating layer/an upper oxide layer. In this case, the intermediary insulating layer is composed of a material selected from a group consisting of nitride, aluminum oxide and tantalum oxide. Furthermore, the edge insulating layer is wider than the gate electrode on the boundary of the trench isolation region and the active region, and the trench isolation region may include a nitride liner.

According to another exemplary embodiment of the present invention, a method of fabricating a MOS Field Effect Transistor having a trench isolation region is provided. The method includes forming a trench isolation region in a predetermined portion of a semiconductor substrate to define an active region. After forming a first insulating layer pattern that covers at least a boundary of the trench isolation region and the active region and exposes a channel region of the transistor, a second insulating layer is formed on an at least substantially an entire surface of the semiconductor substrate where the first insulating layer pattern is formed. Then, a gate electrode is formed on at least substantially an entire surface of the semiconductor substrate where the second insulating layer and first insulating layer pattern have been formed and wherein the gate electrode crosses over the boundary of the trench isolation region and the active region.

Moreover, after forming the trench isolation region, a source region and a drain region spaced apart from each other within the active region may be formed. Otherwise, after forming the gate electrode, a source region and a drain region spaced apart from each other within the active region are formed using the gate electrode as an ion implantation mask.

According to the exemplary embodiments of the present invention, when applying the STI, an edge insulating layer underlying a gate electrode around a trench isolation region and an active region is thicker than a gate insulating layer disposed on an upper surface of a channel region. Therefore, a dent induced on a boundary of the trench isolation region and the active region is prevented to relieve an electric field that concentrates on the boundary, thereby inhibiting a leakage current. Furthermore, an edge gate insulating pattern and a central gate insulating layer are readily fabricated using deposition and etching that are generally employed in typical fabrication processes for semiconductor devices.

DETAILED DESCRIPTION OF THE EXEMPLARY EMBODIMENTS OF THE INVENTION

The present invention will now be described more fully with reference to the accompanying drawings, in which exemplary embodiments of the invention are shown.

Figure 1:
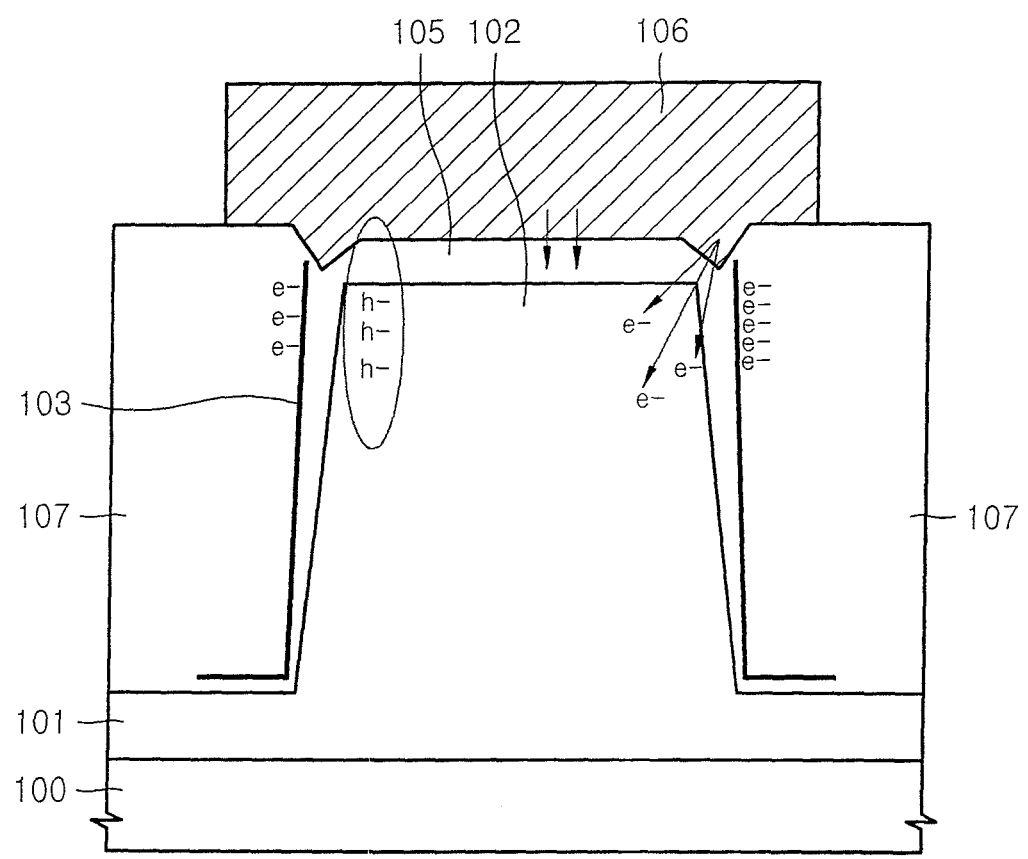
FIG. 1 is a sectional view of a MOS Field Effect transistor having a trench isolation region fabricated using a conventional technique.
Figure 2:
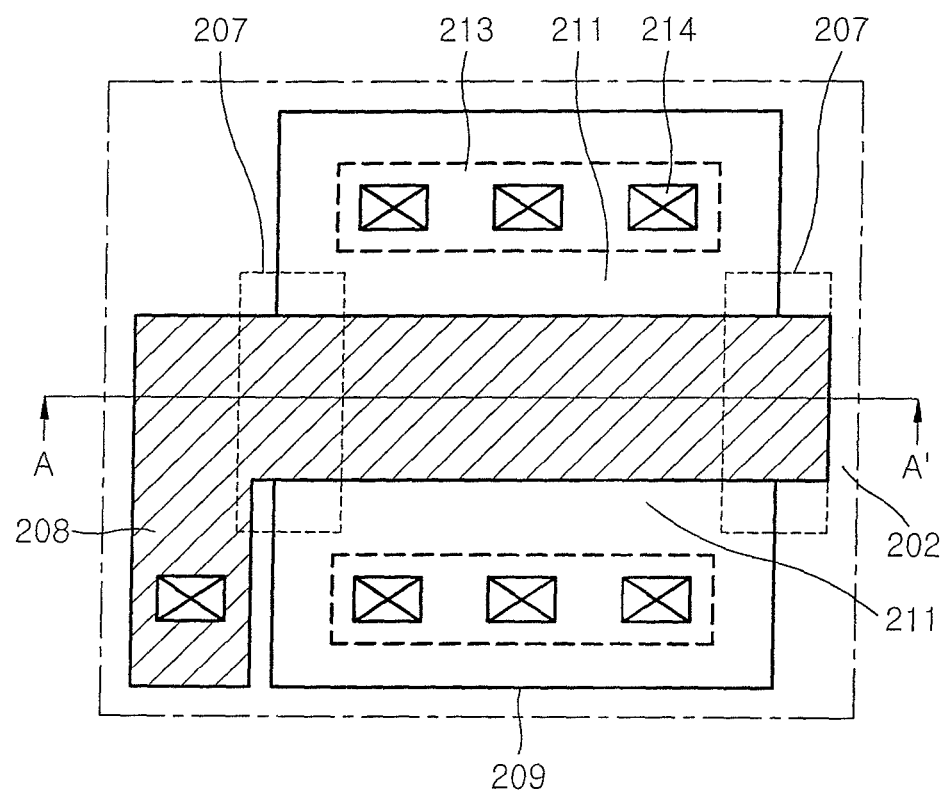
FIG. 2 is a layout of a MOS Field Effect transistor having a trench isolation region according to an exemplary embodiment of the present invention.
Figure 5:
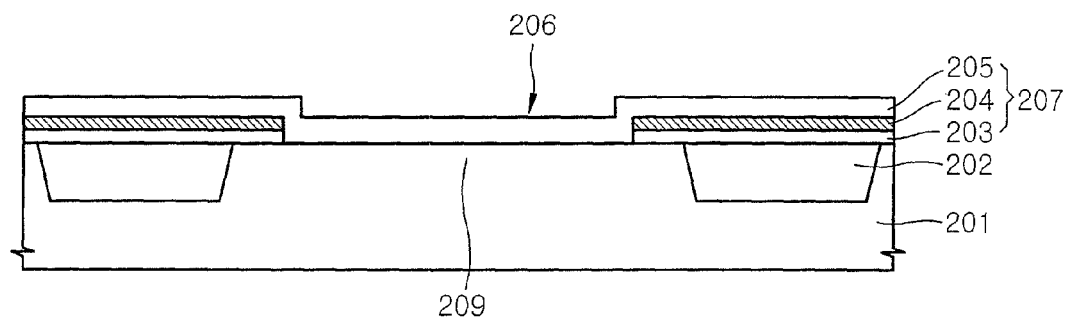
Figure 6:
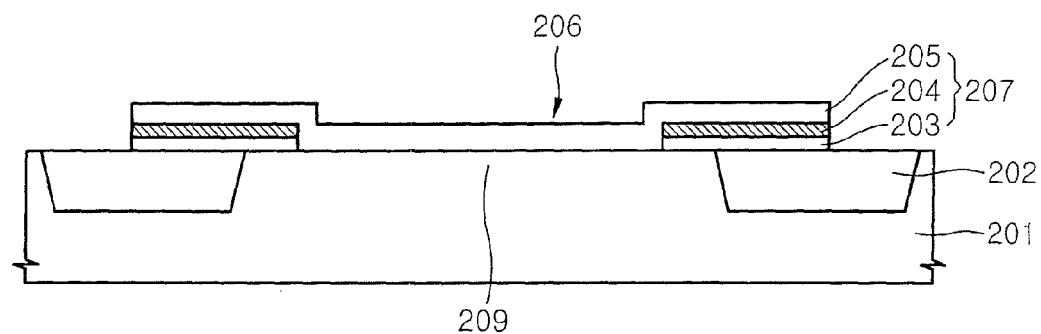
Figure 7:
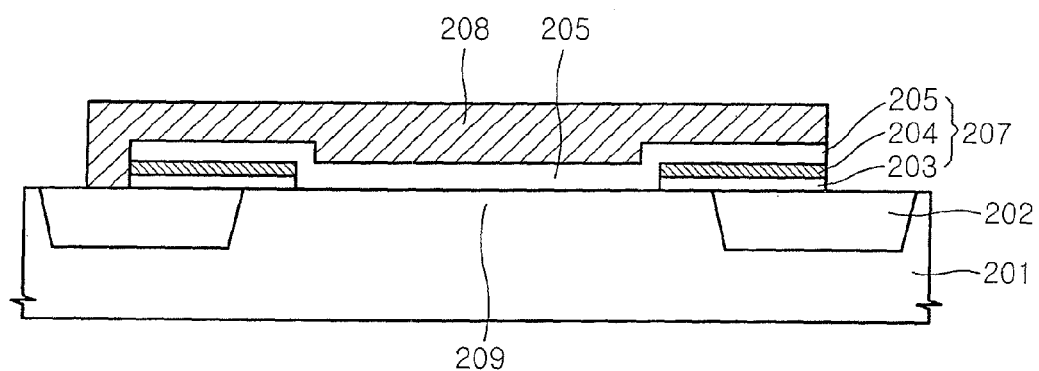

FIGS. 2 through 7 illustrate a structure of a MOS Field Effect transistor according to an exemplary embodiment of the present invention. FIG. 2 is a layout thereof, and FIG. 7 is a sectional view illustrating a high voltage (HV) region with a high voltage transistor, taken along a line A-A' of FIG. 2. In certain cases, a low voltage (LV) region formed with a low voltage transistor thereon may be formed in the identical substrate. For example, in an LDI product, a high voltage transistor for driving a Liquid Crystal Display (LCD) is formed in the HV region, and a low voltage transistor for logic may be formed in the LV region. The exemplary embodiments of the present invention is not limited to the aforementioned LDI structure, but may be applied to various types of semiconductor devices as long as a high voltage transistor is formed at least in the HV region.

Referring to FIGS. 2 and 7, in the HV region, a trench-shaped isolation region 202 is disposed in a predetermined portion of a semiconductor substrate 201 composed of single-crystalline silicon. The trench isolation region 202 defines an active region 209 where a transistor is operated. A gate electrode 208 is disposed on an upper portion of the active region 209, and extends by crossing over the trench isolation region 202. In addition, a source region/a drain region 211 spaced apart from each other by a predetermined interval are formed within the active region 209. A channel region is disposed between the source region and the drain region 211, and the gate electrode 208 extends over the channel region.

The source/drain regions 211 which are formed perpendicularly to a lengthwise direction of the gate electrode 208 form relatively low density regions, and a high density region 213 doped with an impurity ion with a density higher than that of the source/drain regions 211 is partially formed, thereby constituting a Double Diffused Drain (DDD) structure. In this exemplary embodiment, the high density region 213 is formed where source/drain contacts 214 will be formed after forming an interlayer insulating layer and then forming contact holes by a subsequent process, thereby securing an ohmic contact.

An edge insulating layer 207 in the form of a triple layer formed by stacking a first insulating layer 203, a second insulating layer 204, and a third insulating layer 205 is interposed between the gate electrode 208 and the boundary of the trench isolation region 202 and the active region 209. A gate insulating layer with the single-layered structure, e.g., the third insulating layer 205, is formed between the active region 209 and the gate electrode 208. The gate insulating layer 205 may have a thickness of about 150 to about 1000 angstroms (Å), and the edge insulating layer 207 contacting the gate insulating layer may have a thickness of about 200 to about 10000 Å.

The edge insulating layer 207 with the triple-layered structure prevents the formation of a dent around the boundary of the trench isolation region 202 and the active region 209. In turn, the thinning of the insulating layer is prevented to inhibit the leakage current generated on the boundary.

Referring to FIG. 2 and FIGS. 3 through 7, a method of fabricating the MOS Field Effect transistor according to an exemplary embodiment of the present invention will be described. FIG. 2 is the layout, and FIGS. 3 through 7 are sectional views illustrating the high voltage region, taken along the line A-A' of FIG. 2.

Figure 3:
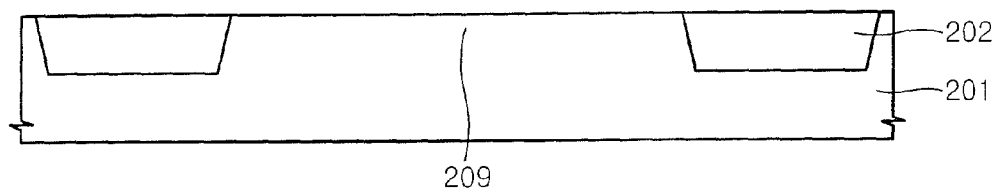
FIGS. 3 through 7 are sectional views illustrating a method of fabricating the MOS Field Effect transistor having the trench isolation region according to an exemplary embodiment of the present invention.

Referring to FIG. 3, the isolation region 202 with the Shallow Trench Isolation (STI) structure is formed on a predetermined portion of a semiconductor substrate 201 composed of, e.g., single-crystalline silicon. The trench-type isolation region 202 defines the active region 209. According to the STI applied to form the isolation region 202, a buffer oxide layer and an oxidation preventing layer are formed on the entire or substantially the entire surface of the semiconductor substrate 201. In this case, the buffer oxide layer may be composed of thermal oxide, and the oxidation preventing layer may be composed of silicon nitride. Then, a photoresist pattern is formed on the oxidation preventing layer. The photoresist pattern covers an upper surface of the active region 209, and exposes a region that will be the trench isolation region 202.

Subsequently, using the photoresist pattern or the oxidation preventing layer as an etch mask, at least the oxidation preventing layer and the buffer oxide layer are etched to form sequentially stacked a buffer oxide layer pattern and an oxidation preventing layer pattern. The stacked buffer oxide layer pattern and the oxidation preventing layer pattern cover the active region 209, and expose a portion where the isolation region 202 will be formed. After etching the exposed semiconductor substrate 201 in the portion of the device isolation region to form a trench, the trench isolation region 202 is formed. The trench isolation region 202 is formed using a gap-fill insulating material such as thermal oxide, nitride liner and oxide along an inner wall of the trench.

Figure 4:
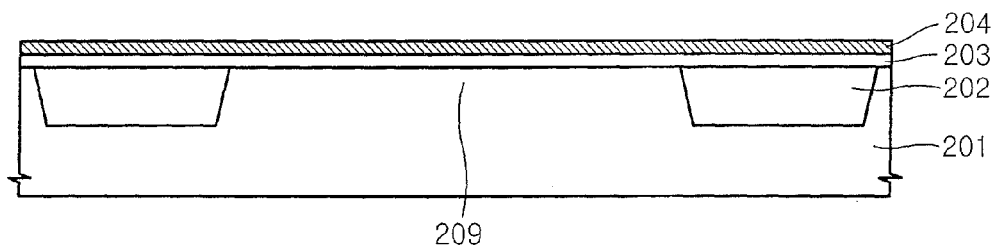

Referring to FIGS. 2 and 4, an ion implantation mask such as a photoresist mask, a silicon oxide layer and a silicon nitride layer mask is formed on the entire or substantially the entire surface of the semiconductor substrate 201 using photolithography. Then, the source/drain regions 211 are formed in the active region 209 using ion implantation at a low density. The source/drain regions 211 are lightly doped diffusion layers, which are formed by implanting phosphorus with a density of about 2.0 E12 to about 5.0 E15 at an energy of about 150 KeV to about 300 KeV. The light voltage region is covered with an ion implantation mask so as not to be doped with an ion.

The source/drain regions 211 can be formed after the gate electrode 208 shown in FIG. 7 is patterned, and then used as an ion implantation mask.

After removing the ion implantation mask, the first insulating layer 203 and the second insulating layer 204 are sequentially stacked on the entire or substantially the entire surface of the semiconductor substrate 201. The first insulating layer 203 is composed of, e.g., oxide. The oxide layer is formed to have a thickness of about 50 to about 500 Å, and preferably about 100 to about 200 Å, using a chemical vapour deposition (CVD) process. Then, the second insulating layer 204 is formed. The second insulating layer 204 is stacked using CVD to a thickness of about 50 to about 500 Å, and preferably about 100 to about 200 Å. The second insulating layer 204 may be composed of diverse kinds of insulating materials, e.g., a nitride group such as silicon nitride, or a metal oxide group such as alumina or tantalum.

Referring to FIG. 5, the first insulating layer 203 and the second insulating layer 204 are removed using photolithography, thereby exposing the semiconductor substrate 201 of the active region 209 including the channel region disposed between the source/drain regions 211. In this case, the first insulating layer 203 and the second insulating layer 204 are left on the boundary of the trench isolation region 202 and the active region 209. As illustrated in the plan view of FIG. 2, the first insulating layer 202 and the third insulating layer 204 in the source/drain regions 211 direction are wider than the gate electrode 208 on the boundary of the trench isolation region 202 and the active region 209.

Thereafter, the third insulating layer 205 is stacked on the entire or substantially the entire surface of the resultant structure. The third insulating layer 205 may be composed of, e.g., oxide. The oxide layer is stacked to a thickness of about 200 to about 2000 Å, and preferably about 500 to about 700 Å, using CVD. The third insulating layer 205 acts as a single-layered gate insulating layer on the lower surface of the gate electrode 208, and partially constitutes the edge insulating layer 207 together with the first insulating layer 202 and the second insulating layer 203 on the boundary of the trench isolation region 202 and the active region 209.

The triple-layered structure comprising the oxide layer/the nitride layer/the oxide layer of the edge insulating layer 207 is equivalent to a structure of a layer acting as a dielectric film formed between upper and lower conductive material layers formed when forming a capacitor of a semiconductor device. Accordingly, when fabricating a semiconductor transistor that requires a capacitor, the dielectric film can be formed by the forming of the edge insulating layer without separately performing a process of forming a field transistor. Generally, a high voltage transistor and a capacitor are used together in chips for driving LCD panels, and the dielectric film with the foregoing triple structure of oxide/nitride/oxide applied to the capacitor is available in terms of simplifying the fabricating process. Such a capacitor may be formed on both the high voltage region and the low voltage region.

On the other hand, the edge insulating layer 207 has the triple-layered structure of the first insulating layer 203, the second insulating layer 204, the third insulating layer 205 in this exemplary embodiment. However, the edge insulating layer 207 may alternatively have a double-layered structure by taking into consideration the etch selectivity between the insulating layers. For example, an oxide layer/an oxide layer structure may be applied.

Referring to FIG. 6, the triple-layered structure of the first insulating layer 203, the second insulating layer 204, and the third insulating layer 205 may be etched and patterned in accordance with a particular design. The triple-layered structure may be patterned before or after forming the gate electrode. In this exemplary embodiment, because only a predetermined portion of the boundary of the trench isolation region 202 and the active region 209 is the triple-layered insulating layer as shown in FIG. 2, the triple-layered structure may be patterned before forming the gate electrode 208.

Referring to FIG. 7, after covering a conductive material on the patterned insulating layer with the triple-layered structure, the gate electrode 208 is formed. Furthermore, the third insulating layer 205 is etched or remains unchanged to form the gate insulating layer relatively thin in the light voltage region formed on a periphery of the semiconductor substrate 201. When source/drain regions have not already been formed in the preceding process, the source/drain regions 211 may be formed after forming the gate electrode 208, using the gate electrode 208 as an ion implantation mask as described above. When patterning the triple-layered insulating layer, the triple layer on the source/drain regions 211 within the high voltage transistor region is partially etched, and a high density impurity ion is doped to a portion on the source/drain regions 211 from which the triple-layered insulating layer is removed to form the high density region 213. Source/drain contacts 214 are formed in the high density region 213 by a subsequent process, so that the high density region 213 is doped with the impurity ion with a density relatively higher than the density of the source/drain regions 211.

Then, the gate electrode 208 may be composed of, e.g., polysilicon. When forming the gate electrode 208 in the high voltage region, a gate electrode for a low voltage transistor may be simultaneously formed in the low voltage region. Subsequently, a thick interlayer insulating layer composed of, e.g., oxide, is formed on the entire or substantially the entire surface of the semiconductor substrate 201. Then, contact holes for source/drain contacts are formed, and filled with a conductive material to form the source/drain contacts 214.

According to the exemplary embodiments of the present invention, a thick edge insulating layer is formed on a boundary of a trench isolation region and an active region to prevent dents and thinning of an oxide layer on the boundary portion. Therefore, a leakage current generated due to concentration of an electric field on the boundary portion is prevented.

While the present invention has been particularly shown and described with reference to exemplary embodiments thereof, it will be understood by those of ordinary skill in the art that various changes in form and details may be made therein without departing from the spirit and scope of the present invention as defined by the appended claims.

What is claimed is:

1. A method of fabricating a Metal Oxide Semiconductor (MOS) Field Effect Transistor having a trench isolation region comprising:

forming the trench isolation region in a predetermined portion of a semiconductor substrate to define an active region;

forming a first insulating layer pattern that covers at least a boundary of the trench isolation region and the active region and exposes a portion of the active region including a channel region of the transistor;

forming a second insulating layer on at least a portion of the first insulating layer pattern and the exposed portion of the active region including the channel region; and forming a gate electrode on at least substantially an entire surface of the semiconductor substrate where the second insulating layer and the first insulating layer pattern have been formed and wherein the gate electrode crosses over the boundary of the trench isolation region and the active region.

2. The method of claim 1, wherein the portion stacked with the first insulating layer and the second insulating layer is thicker than the second insulating layer.

3. The method of claim 1, wherein the first insulating layer pattern comprises a plurality of layers 4. The method of claim 3, wherein an uppermost layer of the first insulating layer pattern and the second insulating layer are each composed of an identical material.

5. The method of claim 3, wherein the first insulating layer pattern comprises a lower oxide layer and an intermediary insulating layer.

6. The method of claim 5, wherein the intermediary insulating layer is composed of a material selected having at least one of nitride, aluminum oxide and tantalum oxide.

7. The method of claim 1, further comprising: after forming the trench isolation region, forming a source region and a drain region spaced apart from each other within the active region.

8. The method of claim 1, further comprising: after forming the gate electrode, forming a source region and a drain region spaced apart from each other within the active region.

9. The method of claim 1, wherein the trench isolation region is formed using a gap-fill insulating material having at least one of an oxide and a nitride.

10. The method of claim 7, wherein the source region and the drain region are formed in the active region using ion implantation.

11. The method of claim 8, wherein the source region and the drain region are formed in the active region using ion implantation.

12. The method of claim 1, wherein the first insulating layer pattern has a thickness of about 100 to about 1000 Å, and the second insulating layer has a thickness of about 200 to about 2000 Å.

13. The method of claim 1, wherein the second insulating layer is simultaneously formed on at least the portion of the first insulating layer pattern and the exposed portion of the active region including the channel region using chemical vapor deposition.

14. The method of claim 1, wherein the first insulating layer pattern and the second insulating layer disposed on the first insulating layer pattern together constitute an edge insulating layer, wherein the edge insulating layer is disposed below the gate electrode and on the trench isolation region and on a portion of the active region adjacent to an edge of the trench isolation region, and wherein the edge insulating layer disposed on the trench isolation region and on the portion of the active region adjacent to the edge of the trench isolation region has a greater thickness than a thickness of the second insulating layer disposed on the exposed portion of the active region including the channel region.

15. A method of fabricating a Metal Oxide Semiconductor (MOS) Field Effect Transistor having a trench isolation region comprising:

forming the trench isolation region in a predetermined portion of a semiconductor substrate to define an active region;

sequentially stacking a first insulating layer and a second insulating layer on substantially an entire surface of the semiconductor substrate;

removing a portion of each of the first insulating layer and the second insulating layer to expose a portion of the active region including a channel region of the transistor and to thereby form a first patterned insulating layer and a second patterned insulating layer sequentially stacked on the trench isolation region and on a portion of the active region adjacent to an edge of the trench isolation region;

forming a third insulating layer on the first and second patterned insulating layers and on the exposed portion of the active region including the channel region to thereby form an edge insulating layer which includes a sequentially stacked structure of the first patterned insulating layer, the second patterned insulating layer and the third insulating layer disposed on the trench isolation region and on the portion of the active region adjacent to the edge of the trench isolation region, wherein the edge insulating layer disposed on the trench isolation region and on the portion of the active region adjacent to the edge of the trench isolation region has a greater thickness than a thickness of the third insulating layer disposed on the exposed portion of the active region including the channel region; and forming a gate electrode on an upper surface of the edge insulating layer and on an upper surface of the third insulating layer disposed on the exposed portion of the active region including the channel region.

16. The method of claim 15, wherein the portion of the gate electrode formed on the upper surface of the third insulating layer which is disposed on the exposed portion of the active region including the channel region is thicker than the portion of the gate electrode disposed on the upper surface of the edge insulating layer.

17. The method of claim 15, further comprising forming a source region and a drain region spaced apart from each other within the active region using ion implantation at a relatively low density.

18. The method of claim 15, wherein the first patterned insulating layer includes an oxide, the second patterned insulating layer includes a nitride and the third insulating layer includes an oxide.

19. The method of claim 17, wherein the source region and the drain region are formed perpendicularly to a lengthwise direction of the gate electrode.

20. The method of claim 19, further comprising forming a high density region in the active region with an impurity ion having a higher density than the density of the source region and the drain region such that the source region and the drain region together with the high density region constitute a double diffused drain structure.

* * * * *